United States Patent
Kim

(10) Patent No.: US 11,552,022 B2
(45) Date of Patent: Jan. 10, 2023

(54) PACKAGE SUBSTRATE AND SEMICONDUCTOR PACKAGE INCLUDING THE SAME

(71) Applicant: SAMSUNG ELECTRONICS CO., LTD., Suwon-si (KR)

(72) Inventor: Seungmin Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 145 days.

(21) Appl. No.: 17/176,756

(22) Filed: Feb. 16, 2021

(65) Prior Publication Data

US 2021/0407916 A1    Dec. 30, 2021

(30) Foreign Application Priority Data

Jun. 29, 2020    (KR) .................. 10-2020-0079056

(51) Int. Cl.
*H01L 23/538* (2006.01)
*H01L 25/065* (2006.01)
*H01L 23/48* (2006.01)

(52) U.S. Cl.
CPC .......... *H01L 23/5386* (2013.01); *H01L 23/48* (2013.01); *H01L 23/5383* (2013.01); *H01L 25/0655* (2013.01)

(58) Field of Classification Search
CPC . H01L 23/5386; H01L 23/48; H01L 23/5383; H01L 25/0655
See application file for complete search history.

(56) References Cited

U.S. PATENT DOCUMENTS

| | | | |
|---|---|---|---|
| 8,952,552 B2 | 2/2015 | Zang et al. | |
| 9,520,352 B2 | 12/2016 | Arisaka et al. | |
| 10,586,716 B2* | 3/2020 | Lu | H01L 21/563 |
| 10,674,601 B2* | 6/2020 | Sugiyama | H05K 1/02 |
| 2008/0305306 A1 | 12/2008 | Yu et al. | |
| 2011/0304059 A1 | 12/2011 | Kobayashi et al. | |
| 2014/0185254 A1 | 7/2014 | Mok et al. | |

(Continued)

FOREIGN PATENT DOCUMENTS

| | | |
|---|---|---|
| KR | 10-2009-0029582 | 3/2009 |
| KR | 10-1080358 | 11/2011 |
| KR | 10-2014-0144487 | 12/2014 |

*Primary Examiner* — Nicholas J Tobergte
(74) *Attorney, Agent, or Firm* — F. Chau & Associates, LLC

(57) ABSTRACT

A package substrate includes: a core insulation layer having first and second package regions and a boundary region between the first and second package regions; a first upper conductive pattern in the first package region; a second upper conductive pattern in the second package region; a first insulation pattern on the core insulation layer to partially expose the first and second upper conductive patterns, wherein the first insulation pattern includes a first trench at the boundary region, and first reinforcing portions in the first trench; a first lower conductive pattern in the first package region; a second lower conductive pattern in the second package region; and a second insulation pattern on the core insulation layer to partially expose the first and second lower conductive patterns, wherein the second insulation pattern includes a second trench at the boundary region, and second reinforcing portions in the second trench.

20 Claims, 14 Drawing Sheets

(56) References Cited

U.S. PATENT DOCUMENTS

| | | | |
|---|---|---|---|
| 2014/0361437 A1 | 12/2014 | Seo et al. | |
| 2019/0103361 A1* | 4/2019 | Raorane | H01L 23/12 |
| 2020/0214122 A1* | 7/2020 | Mizutani | H05K 1/112 |
| 2021/0287992 A1* | 9/2021 | Ishii | H01L 23/5384 |
| 2022/0068904 A1* | 3/2022 | Park | H01L 25/16 |

* cited by examiner

PACKAGE SUBSTRATE AND SEMICONDUCTOR PACKAGE INCLUDING THE SAME

CROSS-REFERENCE TO RELATED APPLICATION

This application claims priority under 35 USC § 119 to Korean Patent Application No. 10-2020-0079056, filed on Jun. 29, 2020 in the Korean Intellectual Property Office (KIPO), the disclosure of which is incorporated by reference herein in its entirety.

TECHNICAL FIELD

Exemplary embodiments of the present inventive concept relate to a package substrate and a semiconductor package including the same. More particularly, exemplary embodiments of the present inventive concept relate to a package substrate used for a packaging process, and a semiconductor package including the package substrate.

DISCUSSION OF THE RELATED ART

Generally, a package substrate may include a core insulation layer, a conductive pattern arranged on the core insulation layer, and an insulation pattern formed on the core insulation layer. The package substrate may be divided into a plurality of package regions.

Typically, the conductive patterns may be formed by a single plating process on a seed layer. Thus, the conductive patterns in the package regions may be electrically connected with each other via a conductive line in a boundary region between the package regions. To electrically isolate the conductive pattern in one package region from the conductive pattern in an adjacent package region, the conductive line and the insulation pattern in the boundary region may be removed.

Generally, the insulation pattern in the boundary region may be removed to expose the core insulation layer.

SUMMARY

According to exemplary embodiment of the present inventive concept, a package substrate includes: a core insulation layer having a first package region, a second package region and a boundary region between the first package region and the second package region; a first upper conductive pattern arranged on the core insulation layer in the first package region; a second upper conductive pattern arranged on the core insulation layer in the second package region, wherein the second upper conductive pattern is electrically isolated from the first upper conductive pattern; a first insulation pattern arranged on the core insulation layer to at least partially expose the first upper conductive pattern and the second upper conductive pattern, wherein the first insulation pattern includes a first trench formed at the boundary region, and a plurality of first reinforcing portions arranged in the first trench; a first lower conductive pattern arranged on the core insulation layer in the first package region and electrically connected with the first upper conductive pattern; a second lower conductive pattern arranged on the core insulation layer in the second package region and electrically connected with the second upper conductive pattern, wherein the second lower conductive pattern is electrically isolated from the first lower conductive pattern; and a second insulation pattern arranged on the core insulation layer to at least partially expose the first lower conductive pattern and the second lower conductive pattern, wherein the second insulation pattern includes a second trench formed at the boundary region, and a plurality of second reinforcing portions arranged in the second trench. Each of the first reinforcing portions has a thickness of about 20% to about 80% of a thickness of the first insulation pattern, and each of the second reinforcing portions has a thickness of about 20% to about 80% of a thickness of the second insulation pattern.

In an exemplary embodiment of the present inventive concept, the first reinforcing portions are a part of the first insulation pattern, and the second reinforcing portions are a part of the second insulation pattern.

In an exemplary embodiment of the present inventive concept, each of the first insulation pattern and the second insulation pattern includes solder resist.

In an exemplary embodiment of the present inventive concept, the first insulation pattern has a plurality of first insulation holes formed between the first reinforcing portions to isolate the first upper conductive pattern from the second upper conductive pattern, and the second insulation pattern has a plurality of second insulation holes formed between the second reinforcing portions to isolate the first lower conductive pattern from the second lower conductive pattern.

In an exemplary embodiment of the present inventive concept, each of the first reinforcing portions has a lower surface contacting an upper surface of the core insulation layer.

In an exemplary embodiment of the present inventive concept, each of the second reinforcing portions has an upper surface contacting a lower surface of the core insulation layer.

According to an exemplary embodiment of the present inventive concept, a package substrate includes: a core insulation layer having at least two package regions and a boundary region between the at least two package regions; upper conductive patterns arranged on the core insulation layer, an upper insulation pattern arranged on the core insulation layer to at least partially expose the upper conductive patterns, wherein the upper insulation pattern includes an upper trench formed at the boundary region; lower conductive patterns arranged on the core insulation layer; a lower insulation pattern arranged on the core insulation layer to partially expose the lower conductive patterns, wherein the lower insulation pattern includes a lower trench formed at the boundary region; and a reinforcing portion arranged in at least one of the upper trench or the lower trench.

In an exemplary embodiment of the present inventive concept, the reinforcing portion is a part of at least one of the upper insulation pattern or the lower insulation pattern.

In an exemplary embodiment of the present inventive concept, each of the upper insulation pattern and the lower insulation pattern includes solder resist.

In an exemplary embodiment of the present inventive concept, the reinforcing portion includes: upper reinforcing portions overlapping the upper trench and positioned between a plurality of upper insulation holes configured to electrically isolate the upper conductive patterns from each other; and lower reinforcing portions overlapping the lower trench and positioned between a plurality of lower insulation holes configured to electrically isolate the lower conductive patterns from each other.

In an exemplary embodiment of the present inventive concept, each of the upper reinforcing portions has a lower surface contacting an upper surface of the core insulation layer.

In an exemplary embodiment of the present inventive concept, each of the lower reinforcing portions has an upper surface contacting a lower surface of the core insulation layer.

In an exemplary embodiment of the present inventive concept, each of the upper reinforcing portions has a thickness of about 20% to about 80% of a thickness of the upper insulation pattern.

In an exemplary embodiment of the present inventive concept, each of the lower reinforcing portions has a thickness of about 20% to about 80% of a thickness of the lower insulation pattern.

In an exemplary embodiment of the present inventive concept, the upper trench and the lower trench surround each of the at least two package regions.

In an exemplary embodiment of the present inventive concept, the upper conductive patterns include: a first upper conductive pattern arranged on an upper surface of the core insulation layer in a first package region among the at least two package regions; and a second upper conductive pattern arranged on the upper surface of the core insulation layer in a second package region of the at least two package regions, wherein the second package region is adjacent to the first package region, and the second upper conductive pattern is electrically isolated from the first upper conductive pattern by the upper trench.

In an exemplary embodiment of the present inventive concept, the lower conductive patterns include: a first lower conductive pattern arranged on a lower surface of the core insulation layer in a first package region among the at least two package regions; and a second lower conductive pattern arranged on the lower surface of the core insulation layer in a second package region of the at least two package regions, wherein the second package region is adjacent to the first package region, and the second lower conductive pattern is electrically isolated from the first lower conductive pattern by the lower trench.

According to an exemplary embodiment of the present inventive concept, a semiconductor package includes: a package substrate including a core insulation layer, an upper conductive pattern, an upper insulation pattern, a lower conductive pattern, a lower insulation pattern and a reinforcing portion, wherein the core insulation layer has at least two package regions and a boundary region between the at least two package regions, wherein the upper conductive pattern is arranged on the core insulation layer, wherein the upper insulation pattern is arranged on the core insulation layer to at least partially expose the upper conductive patterns, wherein the upper insulation pattern includes an upper trench formed at the boundary region, wherein the lower conductive pattern is arranged on the core insulation layer, wherein the lower insulation pattern is arranged on the core insulation layer to partially expose the lower conductive patterns, wherein the lower insulation pattern includes a lower trench formed at the boundary region, and wherein the reinforcing portion is arranged in at least one of the upper trench or the lower trench; at least one semiconductor chip arranged on the package substrate and electrically connected with the upper conductive pattern; and a molding member arranged on the package substrate to cover the at least one semiconductor chip.

In an exemplary embodiment of the present inventive concept, the reinforcing portion is a part of at least one of the upper insulation pattern or the lower insulation pattern.

In an exemplary embodiment of the present inventive concept, the semiconductor package further includes external terminals mounted on the package substrate and electrically connected with the lower conductive pattern.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1:
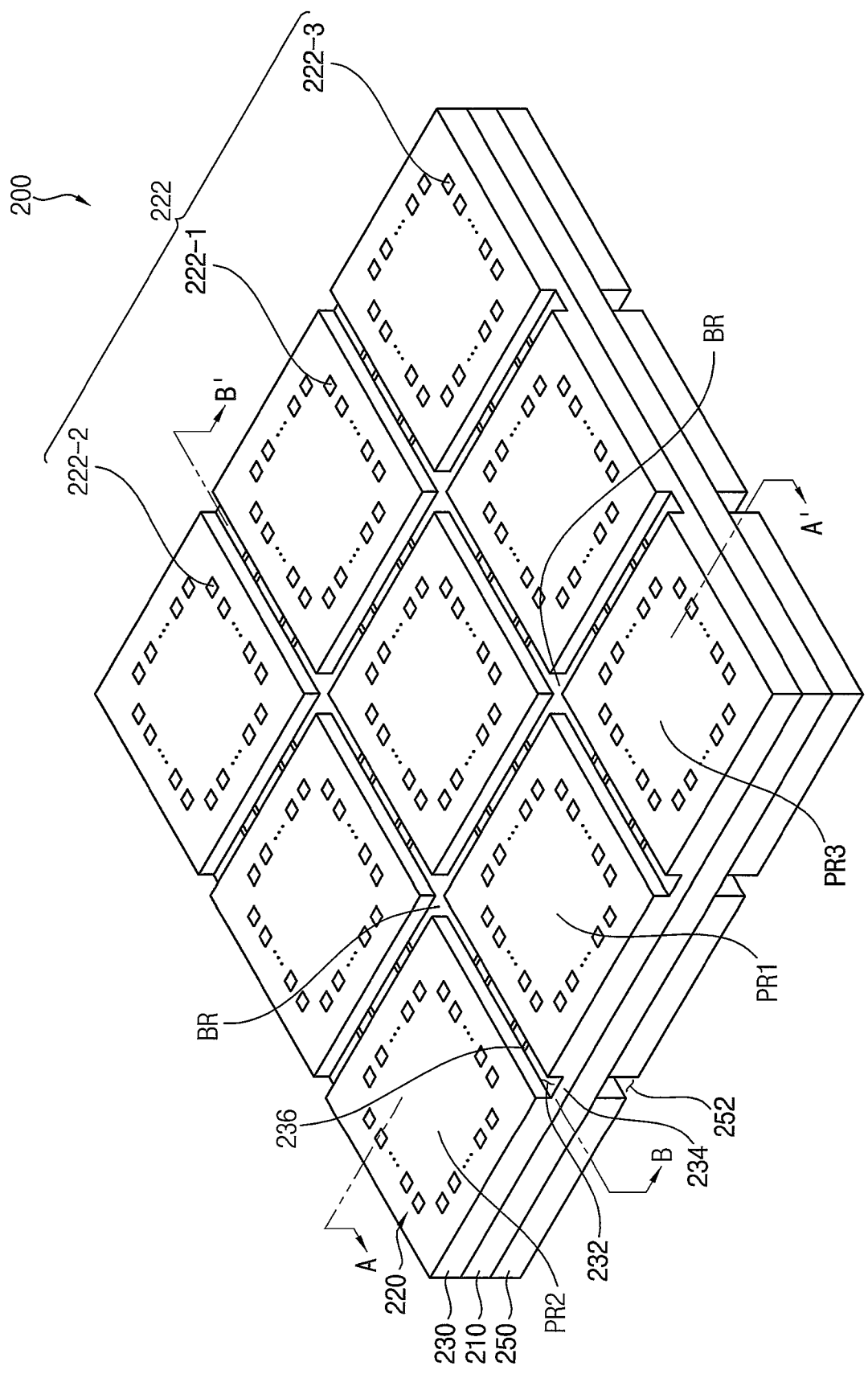
FIG. 1 is a perspective view illustrating a package substrate in according to an exemplary embodiment of the present inventive concept.
Figure 2:
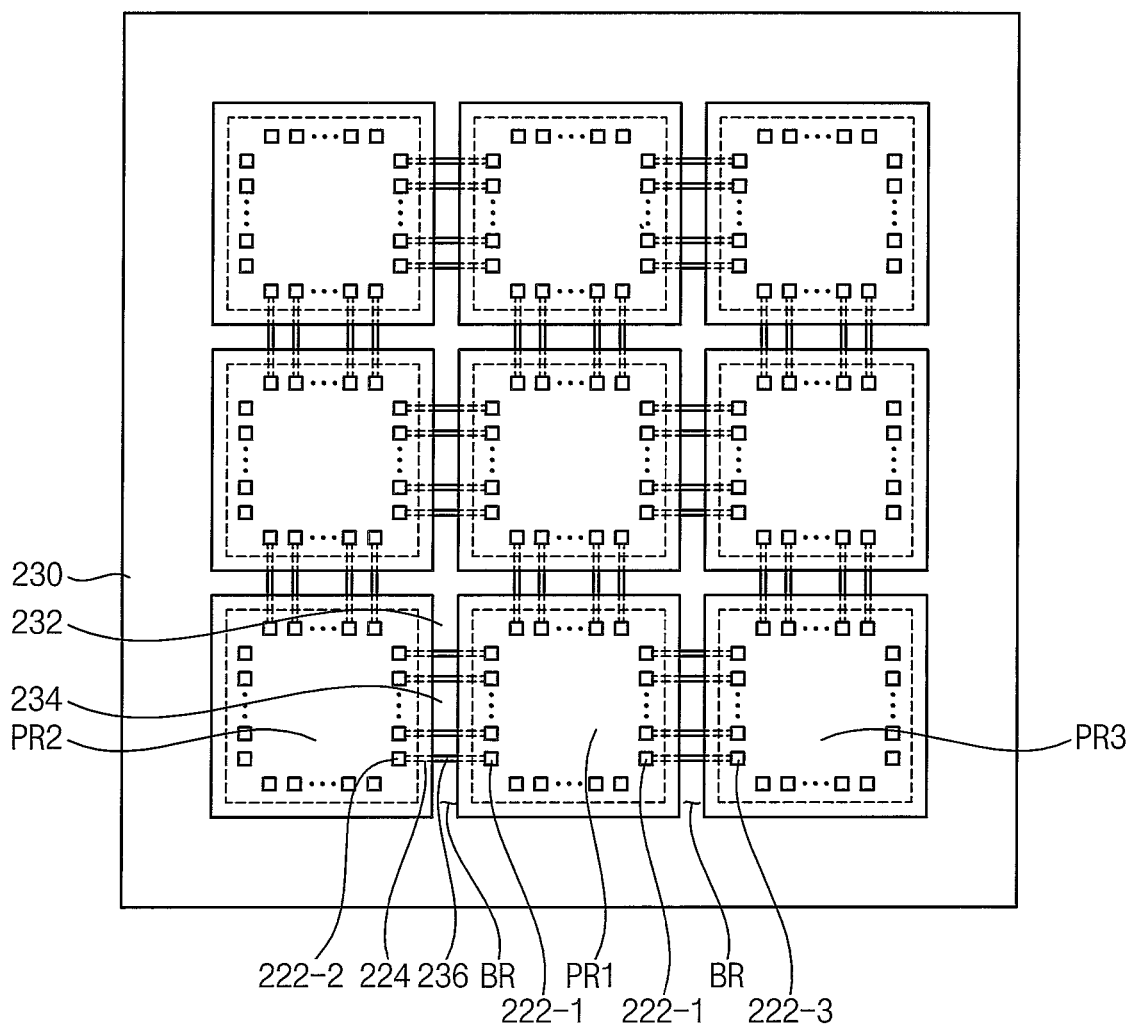
FIG. 2 is a plan view illustrating a package substrate in FIG. 1.
Figure 3:
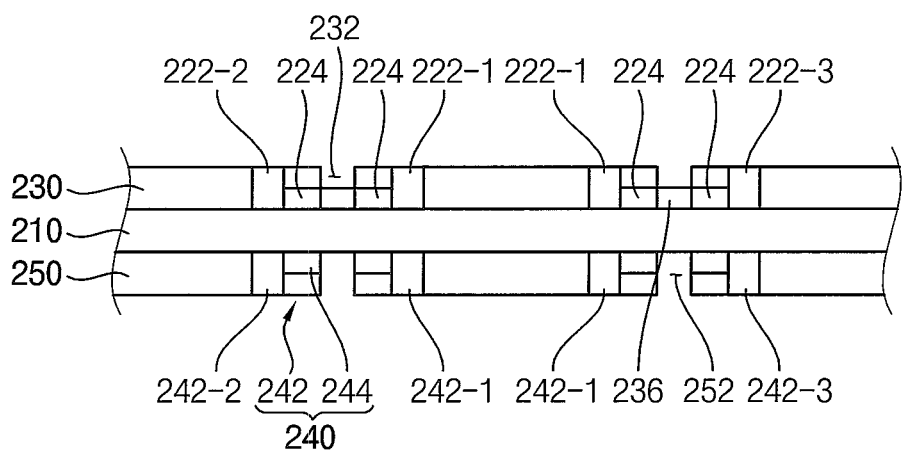
FIG. 3 is a cross-sectional view taken along a line A-A' in FIG. 1.
Figure 4:
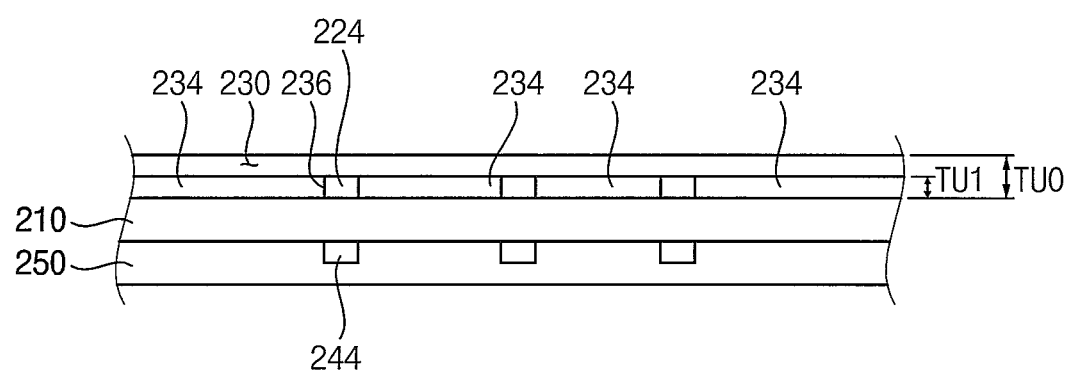
FIG. 4 is a cross-sectional view taken along a line B-B' in FIG. 1.

FIG. 1 is a perspective view illustrating a package substrate according to an exemplary embodiment of the present inventive concept. FIG. 2 is a plan view illustrating a package substrate in FIG. 1. FIG. 3 is a cross-sectional view taken along a line A-A' in FIG. 1, and FIG. 4 is a cross-sectional view taken along a line B-B' in FIG. 1.

Referring to FIGS. 1 to 4, a package substrate 200 may include a core insulation layer 210, an upper conductive pattern 220, an upper insulation pattern 230, a lower conductive pattern 240 and a lower insulation pattern 250.

The package substrate 200 may include a plurality of package regions and a boundary region BR between the package regions. A packaging process for the package substrate 200 may be performed on the package regions. At least one semiconductor chip may be arranged in each of the package regions. The package regions may be spaced apart from each other by a substantially uniform gap in lengthwise and breadthwise directions. In an exemplary embodiment of the present inventive concept, each of the package regions may have a rectangular shape. The boundary region BR may be positioned between the package regions. For example, the boundary region BR may be between neighboring package regions. For example, there may be nine package regions, but the present inventive concept is not restricted thereto.

In an exemplary embodiment of the present inventive concept, the package regions may include a first package region PR1, a second package region PR2 positioned left the first package region PR1, and a third package region PR3 positioned right the first package region PR1. For example, the first package region PR1 may be positioned between the second package region PR2 and the third package region PR3. Thus, the boundary region BR may be positioned between the first package region PR1 and the second package region PR2, and between the first package region PR1 and the third package region PR3.

For example, the core insulation layer 210 may include an insulation material. However, the present inventive concept is not restricted thereto. For example, the core insulation layer 210 may have a rectangular shape.

The upper conductive pattern 220 may be arranged on the core insulation layer 210. For example, the upper conductive pattern 220 may be disposed on an upper surface of the core insulation layer 210. The upper conductive pattern 220 may include a plurality of upper pads 222 and a plurality of upper plating lines 224 connected between the upper pads 222. For example, the upper pads 222 may include at least one first upper pad 222-1, at least one second upper pad 222-2 and at least one third upper pad 222-3. The first upper pad 222-1 may be positioned in the first package region PR1. The second upper pad 222-2 may be positioned in the second package region PR2. The third upper pad 222-3 may be positioned in the third package region PR3. The upper plating lines 224 may be arranged in the boundary region BR to electrically connect the first upper pad 222-1 and the second upper pad 222-2 to each other, and the first upper pad 222-1 and the third upper pad 222-3 with each other. The upper conductive patterns 220 may include a metal such as copper.

In an exemplary embodiment of the present inventive concept, the upper conductive pattern 220 may be formed by a single plating process on a seed layer, which may be formed on the upper surface of the core insulation layer 210. To form the upper conductive pattern 220 by the single plating process, a portion of the seed layer in the first package region PR1, a portion of the seed layer in the second package region PR2 and a portion of the seed layer in the third package region PR3 may be electrically connected with each other via a portion of the seed layer in the boundary region BR. Thus, the single plating process may be performed on the seed layer to form the first upper pad 222-1 in the first package region PR1, the second upper pad 222-2 in the second package region PR2 and the third upper pad 222-3 in the third package region PR3. Further, the upper plating lines 224 may be formed to electrically connect the first upper pad 222-1 and the second upper pad 222-2 to each other, and the first upper pad 222-1 and the third upper pad 222-3 with each other.

To prevent an electrical short between adjacent semiconductor packages through the upper plating line 224 after completing the packaging process on the package substrate 200, the upper plating line 224 in the boundary region BR may be removed. For example, the upper plating line 224 may be removed to electrically isolate the first upper pad 222-1 from the second upper pad 222-2 and the third upper pad 222-3.

The upper insulation pattern 230 may be formed on the upper surface of the core insulation layer 210. For example, the upper insulation pattern 230 may be formed on the upper surfaces of the first package region PR1, the second package region PR2 and the third package region PR3, and the upper surface of the boundary region BR. The upper insulation pattern 230 may have openings configured to expose the first upper pad 222-1, the second upper pad 222-2 and the third upper pad 222-3 of the upper conductive pattern 220. In addition, the upper insulation pattern 230 BR may cover portions of the upper plating lines 224 so that the portions of the upper plating lines 224 may not be exposed. For example, the upper insulation pattern 230 may be disposed in the boundary region BR, and may cover portions of the upper plating lines 224 in the boundary region BR. The upper insulation pattern 230 may include, for example, solder resist, but the present inventive concept is not restricted thereto.

Because the upper plating lines 224 may be covered with the upper insulation pattern 230, to remove the upper plating lines 224 in the boundary region BR, it may be desired to previously remove the upper insulation pattern 230 in the boundary region BR.

In an exemplary embodiment of the present inventive concept, a removed thickness of the upper insulation pattern 230 may be less than a thickness TU0 of the upper insulation pattern 230. For example, the upper insulation pattern 230 in the boundary region BR may be partially etched to form an upper trench 232 along the boundary region BR. As mentioned above, the thickness of the etched portion of the upper insulation pattern 230 may be less than the thickness TU0 of portions of the upper insulation pattern 230 that are not etched, and a non-etched portion of the upper insulation pattern 230 (e.g., a remaining portion) may exist in the upper trench 232 after the etching has been performed. Thus, the upper surface of the core insulation layer 210 may not be exposed through the upper trench 232. The remaining portion of the upper insulation pattern 230 may correspond to an upper reinforcing portion 234 configured to reinforce strength of the package substrate 200, particularly, strength of the boundary region BR.

In an exemplary embodiment of the present inventive concept, the upper insulation pattern 230 may be etched until an upper surface of the upper plating line 224 in the boundary region BR may be exposed. Thus, the upper reinforcing portion 234 may have an upper surface substantially coplanar with the upper surface of the upper plating line 224. For example, the upper reinforcing portion 234 may have a thickness TU1 substantially the same as a thickness of the upper plating line 224. In addition, the thickness TU1 of the upper reinforcing portion 234 may be about 20% to about 80% of the thickness TU0 of the upper insulation pattern 230.

After etching the upper insulation pattern 230, the upper plating lines 224 exposed through the upper trench 232 may be removed by an etching process. By removing the upper plating lines 224, a plurality of upper insulation holes 236, which are configured to electrically isolate the first upper pad 222-1 from the second upper pad 222-2 and the third upper pad 222-3, may be formed through the upper insulation pattern 230. The upper surface of the core insulation layer 210 may be exposed through the upper insulation holes 236. The upper insulation holes 236 may be positioned between the upper reinforcing portions 234. Thus, the upper reinforcing portion 234 may be divided into a plurality of the upper reinforcing portions 234 by the upper insulation holes 236.

The lower conductive pattern 240 may be arranged on a lower surface of the core insulation layer 210. The lower conductive pattern 240 may include a plurality of lower pads 242 and a plurality of lower plating lines 244 connected between the lower pads 242. For example, the lower pads 242 may include at least one first lower pad 242-1, at least one second lower pad 242-2 and at least one third lower pad 242-3. The first lower pad 242-1 may be positioned in the first package region PR1. The second lower pad 242-2 may be positioned in the second package region PR2. The third lower pad 242-3 may be positioned in the third package region PR3. The lower plating lines 244 may be arranged in the boundary region BR to electrically connect the first lower pad 242-1 and the second lower pad 242-2 to each other, and the first lower pad 242-1 and the third lower pad 242-3 with each other. The lower conductive patterns 240 may include a metal such as copper.

In an exemplary embodiment of the present inventive concept, the lower conductive pattern 240 may be formed by a single plating process on a seed layer, which may be formed on the lower surface of the core insulation layer 210. To form the lower conductive pattern 240 by the single plating process, a portion of the seed layer in the first package region PR1, a portion of the seed layer in the second package region PR2 and a portion of the seed layer in the third package region PR3 may be electrically connected with each other via a portion of the seed layer in the boundary region BR. Thus, the single plating process may be performed on the seed layer to form the first lower pad 224-1 in the first package region PR1, the second lower pad 242-2 in the second package region PR2 and the third lower pad 242-3 in the third package region PR3. Further, the lower plating lines 244 may be formed to electrically connect the first lower pad 242-1 and the second lower pad 242-2 to each other, and the first lower pad 242-1 and the third lower pad 242-3.

To prevent an electrical short between adjacent the semiconductor packages through the lower plating line 244 after completing the packaging process on the package substrate 200, the lower plating line 244 in the boundary region BR may be removed. For example, the lower plating line 244 may be removed to electrically isolate the first lower pad 242-1 from the second lower pad 242-2 and the third lower pad 242-3.

The lower insulation pattern 250 may be formed on the lower surface of the core insulation layer 210. For example, the lower insulation pattern 250 may be formed on the lower surfaces of the first package region PR1, the second package region PR2 and the third package region PR3, and the lower surface of the boundary region BR. The lower insulation pattern 250 may have openings configured to expose the first lower pad 242-1, the second lower pad 242-2 and the third lower pad 242-3 of the lower conductive pattern 240. In addition, the lower insulation pattern 250 in the boundary region BR may cover the lower plating lines 244 so that the lower plating lines 244 may not be exposed. For example, the lower insulation pattern 250 may include solder resist, but the present inventive concept is not restricted thereto.

Because the lower plating lines 244 may be covered with the lower insulation pattern 250, to remove the lower plating lines 244 in the boundary region BR, it may be desirable to remove the lower insulation pattern 250 covering the lower plating lines 244 in the boundary region BR.

In an exemplary embodiment of the present inventive concept, the lower insulation pattern 250 may be etched until a lower surface of the lower plating line 244 in the boundary region BR may be exposed. For example, an etched thickness of the lower insulation pattern 250 may be substantially the same as a thickness of the lower insulation pattern 250. Thus, a lower trench 252 configured to expose the lower surface of the core insulation layer 210 and the lower plating lines 244 may be formed at the lower insulation pattern 250.

After etching the lower insulation pattern 250, the lower plating lines 244 may be removed by an etching process. The lower trench 252 may be configured to electrically isolate the first lower pad 242-1 from the second lower pad 242-2 and the third lower pad 242-3.

Figure 5:
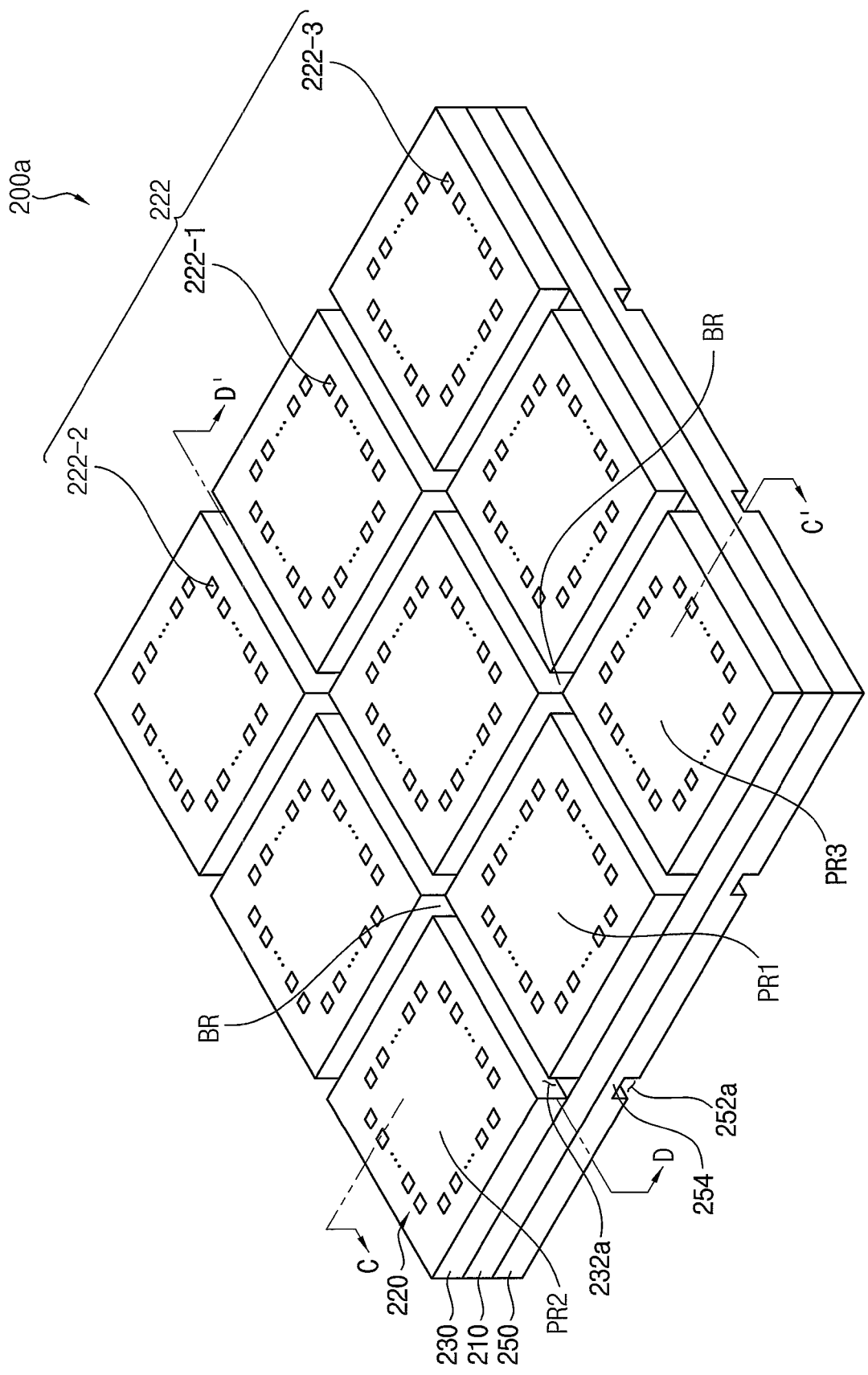
FIG. 5 is a perspective view illustrating a package substrate according to an exemplary embodiment of the present inventive concept.
Figure 6:
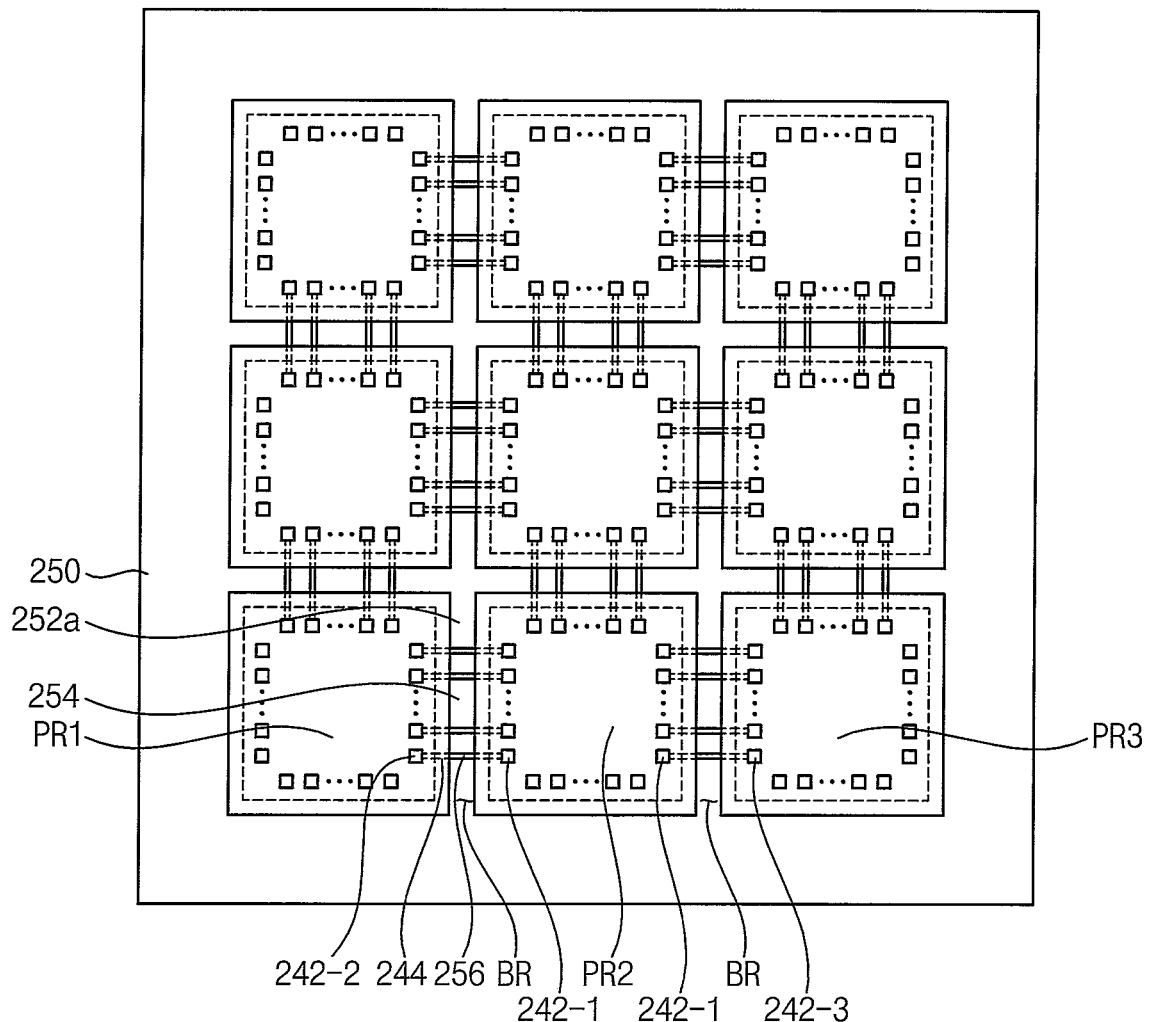
FIG. 6 is a plan view illustrating a package substrate in FIG. 5.
Figure 7:
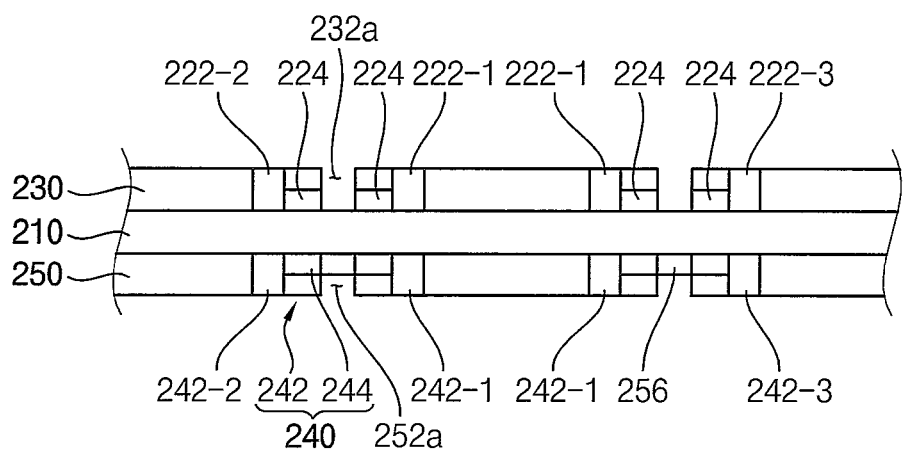
FIG. 7 is a cross-sectional view taken along a line C-C' in FIG. 5.
Figure 8:
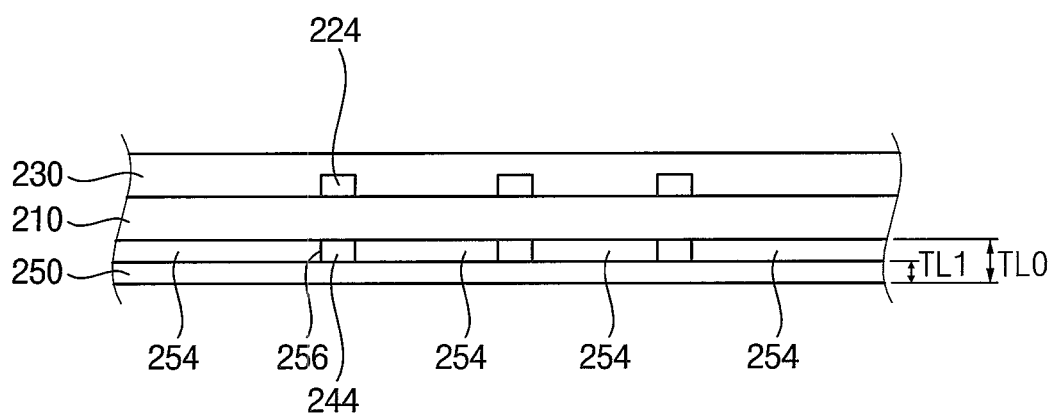
FIG. 8 is a cross-sectional view taken along a line D-D' in FIG. 5.

FIG. 5 is a perspective view illustrating a package substrate according to an exemplary embodiment of the present inventive concept. FIG. 6 is a plan view illustrating a package substrate in FIG. 5. FIG. 7 is a cross-sectional view taken along a line C-C' in FIG. 5, and FIG. 8 is a cross-sectional view taken along a line D-D' in FIG. 5.

A package substrate 200a of this embodiment may include elements substantially the same as those of the package substrate 200 in FIG. 1 except for an upper insulation pattern and a lower insulation pattern. Thus, the same reference numerals may refer to the same elements and any further illustrations with respect to the same elements may be omitted herein for brevity.

Referring to FIGS. 5 to 8, the upper insulation pattern 230 may be formed on the core insulation layer 210. For example, the upper insulation pattern 230 may be disposed on the upper surface of the core insulation layer 210. For example, the upper insulation pattern 230 may be formed on the upper surfaces of the first package region PR1, the second package region PR2 and the third package region PR3, and the upper surface of the boundary region BR. The upper insulation pattern 230 may have openings configured to expose the first upper pad 222-1, the second upper pad 222-2 and the third upper pad 222-3 of the upper conductive pattern 220. In addition, the upper insulation pattern 230 in the boundary region BR may cover the upper plating lines 224 so that the upper plating lines 224 may not be exposed.

Because the upper plating lines 224 may be covered with the upper insulation pattern 230, it may be desirable to remove the upper insulation pattern 230 in the boundary region BR before removing the upper plating lines 224 in the boundary region BR.

In an exemplary embodiment of the present inventive concept, the upper insulation pattern 230 may be etched until the upper surface of the core insulation layer 210 may be exposed. An etched thickness of the upper insulation pattern 230 may be substantially the same as the thickness of the upper insulation pattern 230. Thus, an upper trench 232a, which is configured to expose the upper surface of the core insulation layer 210 and the upper plating lines 224, may be formed at the upper insulation pattern 230.

After etching the upper insulation pattern 230, the upper plating lines 224 may be removed by an etching process. The upper trench 232a may be configured to electrically isolate the first upper pad 222-1 from the second upper pad 222-2 and the third upper pad 222-3.

The lower insulation pattern 250 may be formed on the core insulation layer 210. For example, the lower insulation pattern 250 may be disposed on a lower surface of the core insulation layer 210. For example, the lower insulation pattern 250 may be formed on the lower surfaces of the first package region PR1, the second package region PR2 and the third package region PR3, and the lower surface of the boundary region BR. The lower insulation pattern 250 may have openings configured to expose the first lower pad 242-1, the second lower pad 242-2 and the third lower pad 242-3 of the lower conductive pattern 240. In addition, the lower insulation pattern 250 in the boundary region BR may cover the lower plating lines 244 so that the lower plating lines 244 may not be exposed.

Because the lower plating lines 244 may be covered with the lower insulation pattern 250, it may be desirable to remove the lower insulation pattern 250 in the boundary region BR before removing the lower plating lines 244 in the boundary region BR.

In an exemplary embodiment of the present inventive concept, a removed thickness of the lower insulation pattern 250 may be less than a thickness TL0 of the lower insulation pattern 250. For example, the lower insulation pattern 250 in the boundary region BR may be partially etched to form a lower trench 252a along the boundary region BR. As mentioned above, because the thickness of the etched portion of the lower insulation pattern 250 may be less than the thickness TL0 of portions of the lower insulation pattern 250 that are not etched, a non-etched portion of the lower insulation pattern 250 (e.g., a remaining portion) may exist in the lower trench 252a after the etching has been performed. Thus, the lower surface of the core insulation layer 210 may not be exposed through the lower trench 252a. The remaining portion of the lower insulation pattern 250 may correspond to a lower reinforcing portion 254 configured to reinforce the strength of the package substrate 200, particularly, the strength of the boundary region BR.

In an exemplary embodiment of the present inventive concept, the lower insulation pattern 250 may be etched until a lower surface of the lower plating line 244 in the boundary region BR may be exposed. Thus, the lower reinforcing portion 254 may have a lower surface substantially coplanar with the lower surface of the lower plating line 244. For example, the lower reinforcing portion 254 may have a thickness TL1 substantially the same as a thickness of the lower plating line 244. In addition, the thickness TL1 of the lower reinforcing portion 254 may be about 20% to about 80% of the thickness TL0 of the lower insulation pattern 250.

After etching the lower insulation pattern 250, the lower plating lines 244 exposed through the lower trench 252a may be removed by an etching process. By removing the lower plating lines 244, a plurality of lower insulation holes 256, which are configured to electrically isolate the first lower pad 242-1 from the second lower pad 242-2 and the third lower pad 242-3, may be formed through the lower insulation pattern 250. The lower surface of the core insulation layer 210 may be exposed through the lower insulation holes 256. The lower insulation holes 256 may be positioned between the lower reinforcing portions 254.

Thus, the lower reinforcing portion 254 may be divided into a plurality of the lower reinforcing portions 254 by the lower insulation holes 256.

Figure 9:
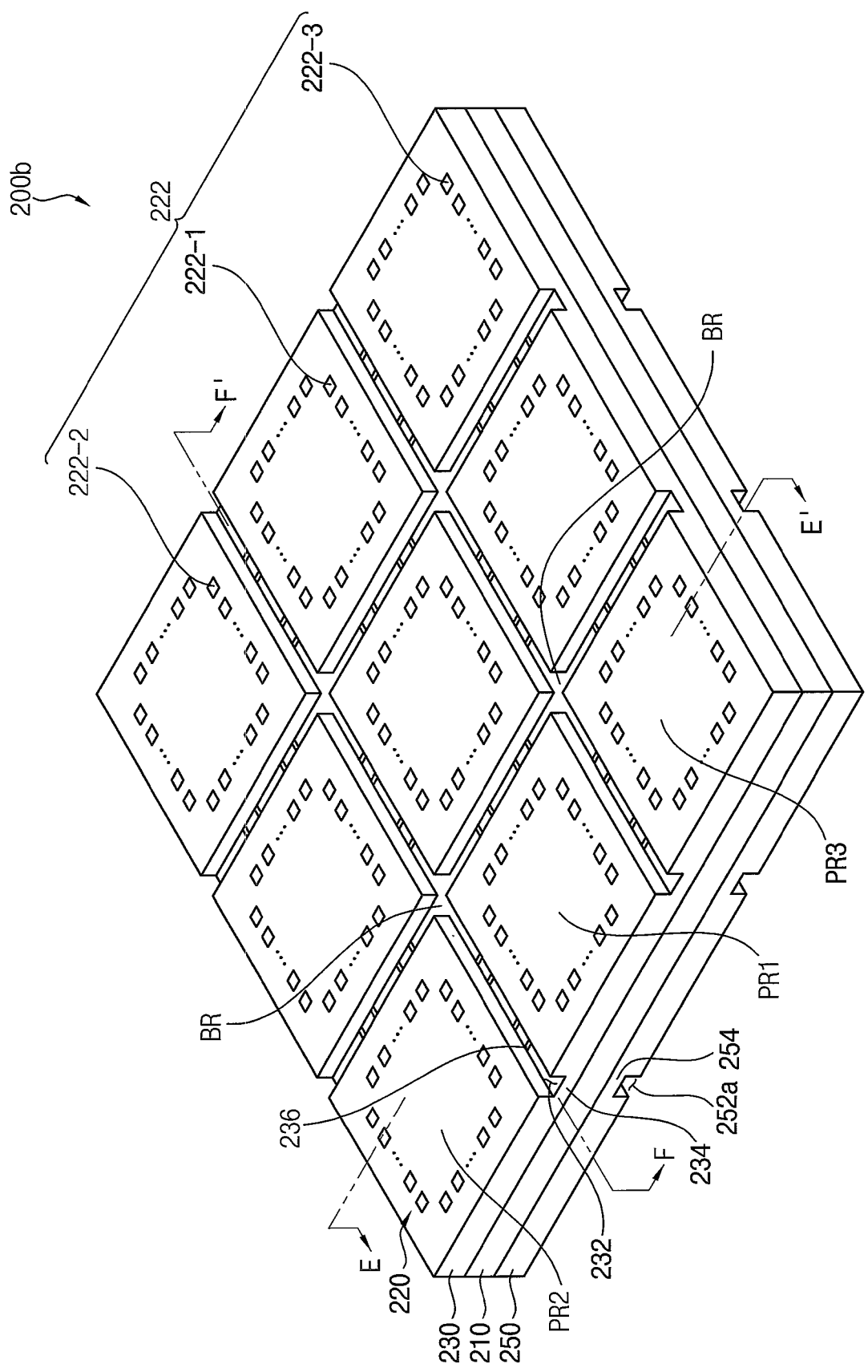
FIG. 9 is a perspective view illustrating a package substrate according to an exemplary embodiment of the present inventive concept.
Figure 10:
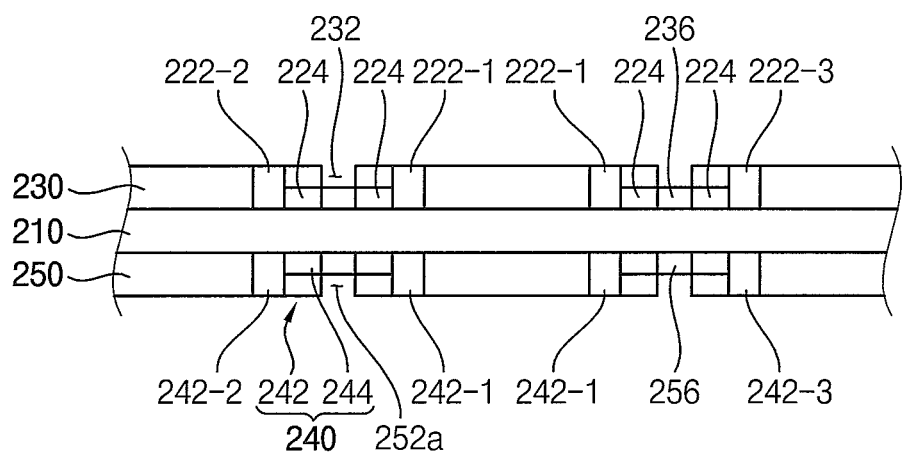
FIG. 10 is a cross-sectional view taken along a line E-E' in FIG. 9.

FIG. 9 is a perspective view illustrating a package substrate according to an exemplary embodiment of the present inventive concept. FIG. 10 is a cross-sectional view taken along a line E-E' in FIG. 9, and FIG. 11 is a cross-sectional view taken along a line F-F' in FIG. 9.

A package substrate 200b of this embodiment may include elements substantially the same as those of the package substrate 200 in FIG. 1 except for an upper insulation pattern and a lower insulation pattern. Thus, the same reference numerals may refer to the same elements and any further illustrations with respect to the same elements may be omitted herein for brevity.

Figure 11:
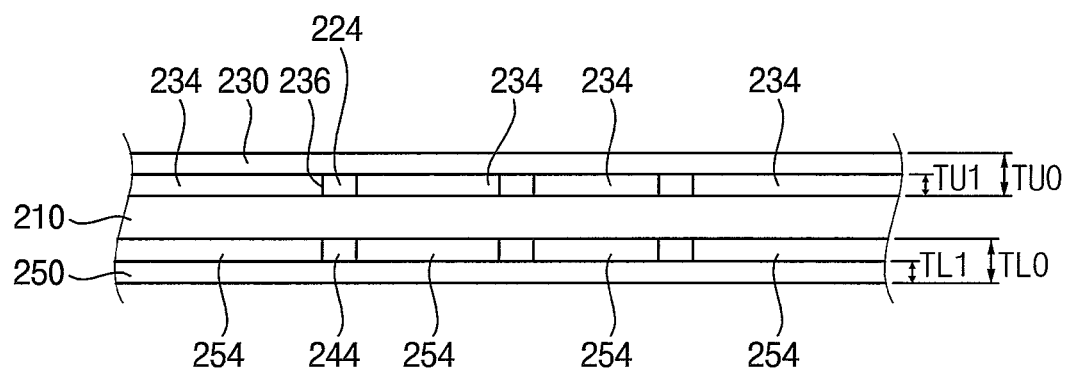
FIG. 11 is a cross-sectional view taken along a line F-F' in FIG. 9.

Referring to FIGS. 9 to 11, the package substrate 200b may include the upper reinforcing portion 234 and the lower reinforcing portion 254.

For example, the upper insulation pattern 230 may be formed on the core insulation layer 210. For example, the upper insulation pattern 230 may be disposed on an upper surface of the core insulation layer 210. For example, the upper insulation pattern 230 may be formed on the upper surfaces of the first package region PR1, the second package region PR2 and the third package region PR3, and the upper surface of the boundary region BR. The upper insulation pattern 230 may have openings configured to expose the first upper pad 222-1, the second upper pad 222-2 and the third upper pad 222-3 of the upper conductive pattern 220. In addition, the upper insulation pattern 230 in the boundary region BR may cover the upper plating lines 224 so that the upper plating lines 224 may not be exposed.

In an exemplary embodiment of the present inventive concept, a removed thickness of the upper insulation pattern 230 may be less than the thickness TU0 of the upper insulation pattern 230. For example, the upper insulation pattern 230 in the boundary region BR may be partially etched to form the upper trench 232 along the boundary region BR. As mentioned above, because the thickness of the etched portion of the upper insulation pattern 230 may be less than the thickness TU0 of portions of the upper insulation pattern 230 that are not etched, a non-etched portion of the upper insulation pattern 230 (e.g., a remaining portion) may exist in the upper trench 232 after the etching has been performed. Thus, the upper surface of the core insulation layer 210 may not be exposed through the upper trench 232. The remaining portion of the upper insulation pattern 230 may correspond to an upper reinforcing portion 234 configured to reinforce strength of the package substrate 200, particularly, strength of the boundary region BR.

In an exemplary embodiment of the present inventive concept, the upper insulation pattern 230 may be etched until an upper surface of the upper plating line 224 in the boundary region BR may be exposed. Thus, the upper reinforcing portion 234 may have an upper surface substantially coplanar with the upper surface of the upper plating line 224. For example, the upper reinforcing portion 234 may have a thickness TU1 substantially the same as a thickness of the upper plating line 224. In addition, the thickness TU1 of the upper reinforcing portion 234 may be about 20% to about 80% of the thickness TU0 of the upper insulation pattern 230.

In an exemplary embodiment of the present inventive concept, the upper reinforcing portion 234 may have a thickness different from that of the thickness of the upper plating line 224.

After etching the upper insulation pattern 230, the upper plating lines 224 exposed through the upper trench 232 may be removed by an etching process. By removing the upper plating lines 224, a plurality of upper insulation holes 236, which are configured to electrically isolate the first upper pad 222-1 from the second upper pad 222-2 and the third upper pad 222-3, may be formed through the upper insulation pattern 230. The upper surface of the core insulation layer 210 may be exposed through the upper insulation holes 236. The upper insulation holes 236 may be positioned between the upper reinforcing portions 234. Thus, the upper reinforcing portion 234 may be divided into a plurality of the upper reinforcing portions 234 by the upper insulation holes 236.

The lower insulation pattern 250 may be formed on the core insulation layer 210. For example, the lower insulation pattern 250 may be disposed on the core insulation layer 210. For example, the lower insulation pattern 250 may be formed on the lower surfaces of the first package region PR1, the second package region PR2 and the third package region PR3, and the lower surface of the boundary region BR. The lower insulation pattern 250 may have openings configured to expose the first lower pad 242-1, the second lower pad 242-2 and the third lower pad 242-3 of the lower conductive pattern 240. In addition, the lower insulation pattern 250 in the boundary region BR may cover the lower plating lines 244 so that the lower plating lines 244 may not be exposed.

In an exemplary embodiment of the present inventive concept, a removed thickness of the lower insulation pattern 250 may be less than a thickness TL0 of the lower insulation pattern 250. For example, the lower insulation pattern 250 in the boundary region BR may be partially etched to form a lower trench 252a along the boundary region BR. As mentioned above, because the thickness of the etched portion of the lower insulation pattern 250 may be less than the thickness TL0 of portions of the lower insulation pattern 250 that are not etched, a non-etched portion of the lower insulation pattern 250 (e.g., a remaining portion) may exist in the lower trench 252a after the etching has been performed. Thus, the lower surface of the core insulation layer 210 may not be exposed through the lower trench 252a. The remaining portion of the lower insulation pattern 250 may correspond to a lower reinforcing portion 254 configured to reinforce the strength of the package substrate 200, particularly, the strength of the boundary region BR.

In an exemplary embodiment of the present inventive concept, the lower insulation pattern 250 may be etched until a lower surface of the lower plating line 244 in the boundary region BR may be exposed. Thus, the lower reinforcing portion 254 may have a lower surface substantially coplanar with the lower surface of the lower plating line 244. For example, the lower reinforcing portion 254 may have a thickness TL1 substantially the same as a thickness of the lower plating line 244. In addition, the thickness TL1 of the lower reinforcing portion 254 may be about 20% to about 80% of the thickness TL of the lower insulation pattern 250.

In an exemplary embodiment of the present inventive concept, the lower reinforcing portion 254 may have a thickness different from that of the thickness of the lower plating line 244.

After etching the lower insulation pattern 250, the lower plating lines 244 exposed through the lower trench 252a may be removed by an etching process. By removing the lower plating lines 244, a plurality of lower insulation holes 256, which are configured to electrically isolate the first lower pad 242-1 from the second lower pad 242-2 and the third lower pad 242-3, may be formed through the lower insulation pattern 250. The lower surface of the core insulation layer 210 may be exposed through the lower insulation holes 256. The lower insulation holes 256 may be positioned between the lower reinforcing portions 254. Thus, the lower reinforcing portion 254 may be divided into a plurality of the lower reinforcing portions 254 by the lower insulation holes 256.

FIGS. 12 to 15 are cross-sectional views illustrating a method of manufacturing the package substrate in FIG. 9 according to an exemplary embodiment of the present inventive concept.

Figure 12:
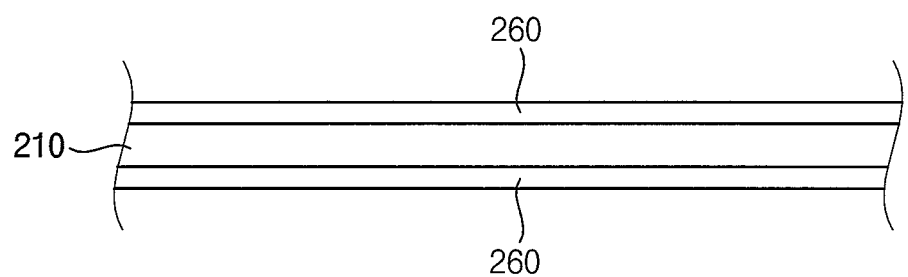
FIGS. 12, 13, 14 and 15 are cross-sectional views illustrating a method of manufacturing the package substrate in FIG. 9 according to an exemplary embodiment of the present inventive concept.

Referring to FIG. 12, a seed layer 260 may be formed on the upper surface and the lower surface of the core insulation layer 210.

Figure 13:
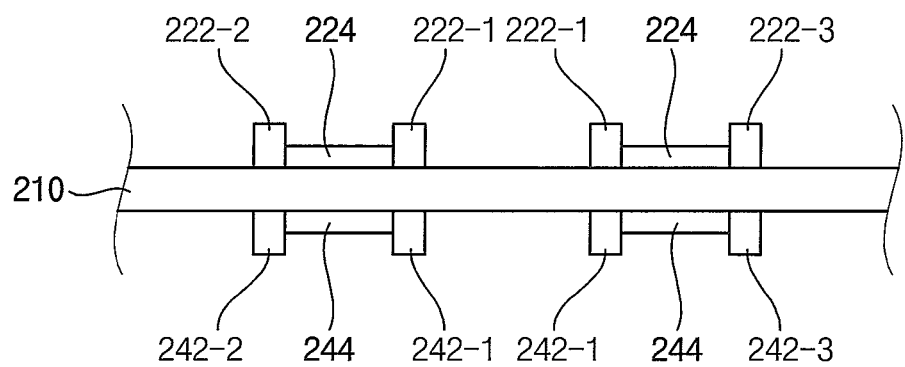

Referring to FIG. 13, a plating process may be formed on the seed layer 260 to form the upper conductive pattern 220, which is formed on the upper surface of the core insulation layer 210, and the lower conductive pattern 240, which is formed on the lower surface of the core insulation layer 210.

As mentioned above, the first upper pad 222-1 in the first package region PR1, the second upper pad 222-2 in the second package region PR2 and the third upper pad 222-3 in the third package region PR3 may be electrically connected with each other via the upper plating lines 224. For example, a first-first upper pad 222-1 may be electrically connected to the second upper pad 222-2, and a second-first upper pad 222-1 may be electrically connected to the third upper pad 222-3. Further, the first lower pad 242-1 in the first package region PR1, the second lower pad 242-2 in the second package region PR2 and the third lower pad 242-3 in the third package region PR3 may be electrically connected with each other via the lower plating lines 244. For example, a first-first lower pad 242-1 may be electrically connected to the second lower pad 242-2, and a second-first lower pad 242-1 may be electrically connected to the third lower pad 242-3.

Figure 14:
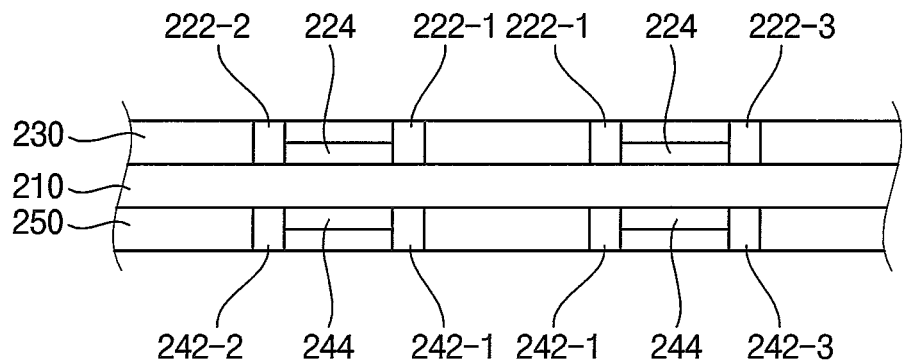

Referring to FIG. 14, the upper insulation pattern 230 may be formed on the upper surface of the core insulation layer 210. The first upper pad 222-1, the second upper pad 222-2 and the third upper pad 222-3 may be exposed through the openings of the upper insulation pattern 230. In addition, the upper plating lines 224 may be covered with the upper insulation pattern 230.

The lower insulation pattern 250 may be formed on the lower surface of the core insulation layer 210. The first lower pad 242-1, the second lower pad 242-2 and the third lower pad 242-3 may be exposed through the openings of the lower insulation pattern 250. In addition, the lower plating lines 244 may be covered with the lower insulation pattern 250.

Figure 15:
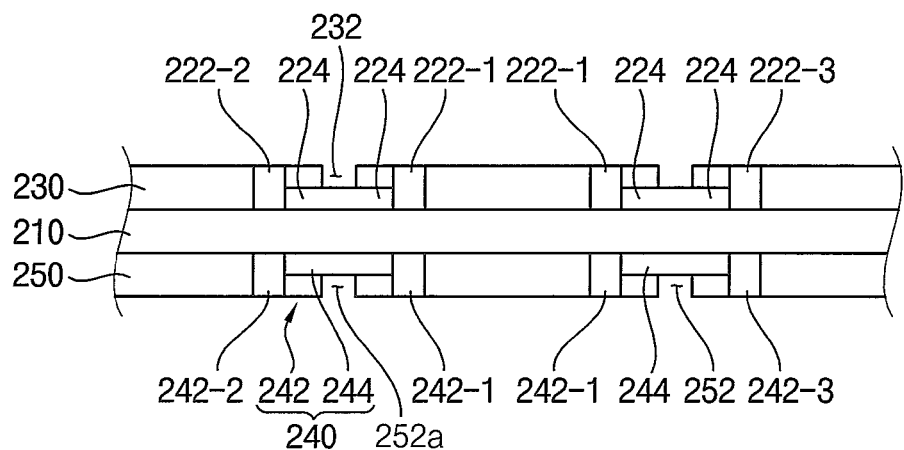

Referring to FIG. 15, the upper insulation pattern 230 in the boundary region BR may be partially etched to form the upper trench 232 along the boundary region BR. The non-etched portion of the upper insulation pattern 230 may exist in the upper trench 232 to form the upper reinforcing portion 234. For example, the lower surface of the upper trench 232 may be an upper surface of the upper reinforcing portion 234. The upper surface of the core insulation layer 210 may not be exposed through the upper trench 232.

Further, the lower insulation pattern 250 in the boundary region BR may be partially etched to form the lower trench 252a along the boundary region BR. The non-etched portion of the lower insulation pattern 250 may exist in the lower trench 252a to form the lower reinforcing portion 254. For example, the upper surface of the lower trench 252a may be a lower surface of the lower reinforcing portion 254. The lower surface of the core insulation layer 210 may not be exposed through the lower trench 252a.

After etching the upper insulation pattern 230, the upper plating lines 224 exposed through the upper trench 232 may be removed by an etching process. By removing the upper plating lines 224, a plurality of upper insulation holes 236, which are configured to electrically isolate the first upper pad 222-1 from the second upper pad 222-2 and the third upper pad 222-3, may be formed through the upper insulation pattern 230. The upper surface of the core insulation layer 210 may be exposed through the upper insulation holes 236. The upper insulation holes 236 may be positioned between the upper reinforcing portions 234. Thus, the upper reinforcing portion 234 may be divided into a plurality of the upper reinforcing portions 234 by the upper insulation holes 236.

Further, after etching the lower insulation pattern 250, the lower plating lines 244 exposed through the lower trench 252a may be removed by an etching process. By removing the lower plating lines 244, a plurality of lower insulation holes 256, which are configured to electrically isolate the first lower pad 242-1 from the second lower pad 242-2 and the third lower pad 242-3, may be formed through the lower insulation pattern 250. The lower surface of the core insulation layer 210 may be exposed through the lower insulation holes 256. The lower insulation holes 256 may be positioned between the lower reinforcing portions 254. Thus, the lower reinforcing portion 254 may be divided into a plurality of the lower reinforcing portions 254 by the lower insulation holes 256 to provide the package substrate 200b in FIG. 9.

Figure 16:
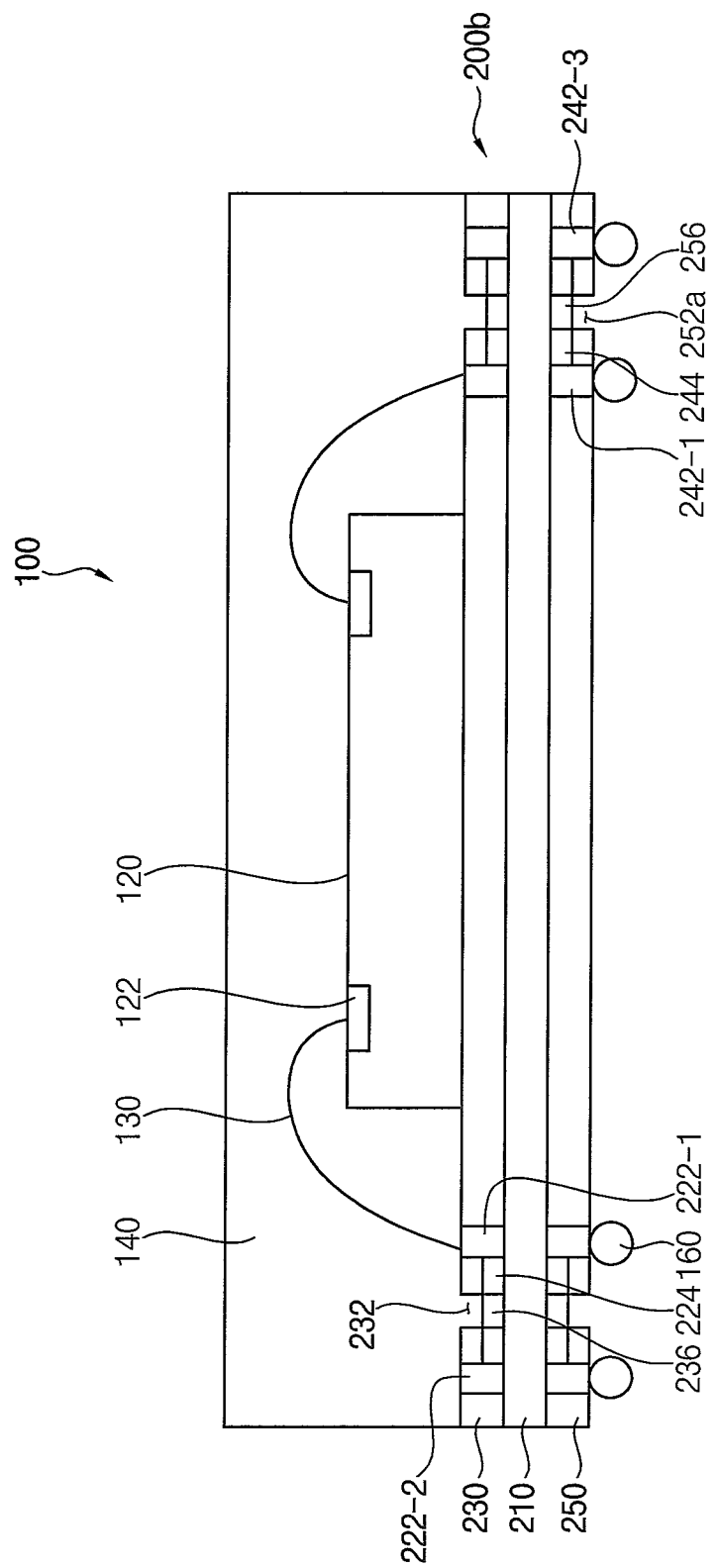
FIG. 16 is a cross-sectional view illustrating a semiconductor package including the package substrate in FIG. 9 according to an exemplary embodiment of the present inventive concept.

FIG. 16 is a cross-sectional view illustrating a semiconductor package including the package substrate in FIG. 9 according to an exemplary embodiment of the present inventive concept.

Referring to FIG. 16, a semiconductor package 100 of this embodiment may include a package substrate 200b, a semiconductor chip 120, a conductive wire 130, a molding member 140 and external terminals 160.

The package substrate 200b may have a structure substantially the same as that of the package substrate 200b in FIG. 9. Thus, any further illustrations and/or descriptions with respect to the package substrate 200b may be omitted herein for brevity. In addition, the semiconductor package 100 may include the package substrate 200 in FIG. 1 or the package substrate 200a in FIG. 5.

The semiconductor chip 120 may be arranged on the package substrate 200b. For example, the semiconductor chip 120 may be disposed on an upper surface of the package substrate 200b. The semiconductor chip 120 may include a pad 122. In an exemplary embodiment of the present inventive concept, the pad 122 may be arranged on an upper surface of the semiconductor chip 120.

The conductive wire 130 may be electrically connected between the pad 122 of the semiconductor chip 120 and the package substrate 200b. For example, the conductive wire 130 may include an upper end connected to the pad 122 of the semiconductor chip 120, and a lower end connected to the package substrate 200b.

The molding member 140 may be arranged on the package substrate 200b to cover the semiconductor chip 120. For example, the molding member 140 may include an epoxy molding compound (EMC).

The external terminals 160 may be mounted on the lower conductive pattern 240 of the package substrate 200b. For example, the external terminals 160 may include solder balls.

Figure 17:
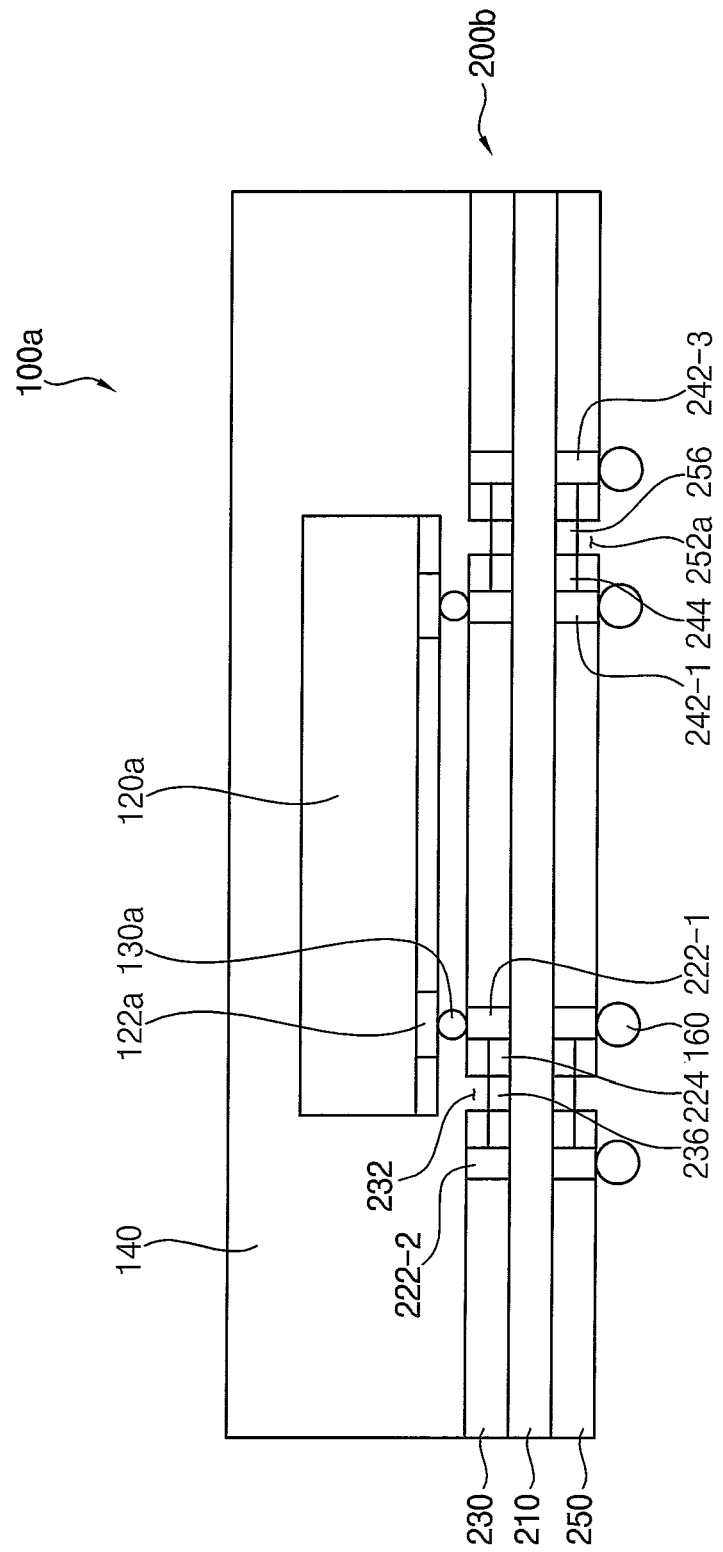
FIG. 17 is a cross-sectional view illustrating a semiconductor package including the package substrate in FIG. 9 according to an exemplary embodiment of the present inventive concept.

FIG. 17 is a cross-sectional view illustrating a semiconductor package including the package substrate in FIG. 9 according to an exemplary embodiment of the present inventive concept.

A semiconductor package 100a of this embodiment may include elements substantially the same as those of the semiconductor package 100 in FIG. 16 except for a semiconductor chip. Thus, the same reference numerals may refer to the same elements and any further illustrations with respect to the same elements may be omitted herein for brevity.

Referring to FIG. 17, a pad 122a may be arranged on a semiconductor chip 120a. The pad 122a may be disposed on a lower surface of the semiconductor chip 120a. The pad 122a of the semiconductor chip 120a may be electrically connected with the upper conductive patterns 220 of the package substrate 200b via a conductive bump 130a.

In addition, the semiconductor package 100a may include the package substrate 200 in FIG. 1 or the package substrate 200a in FIG. 5.

Figure 18:
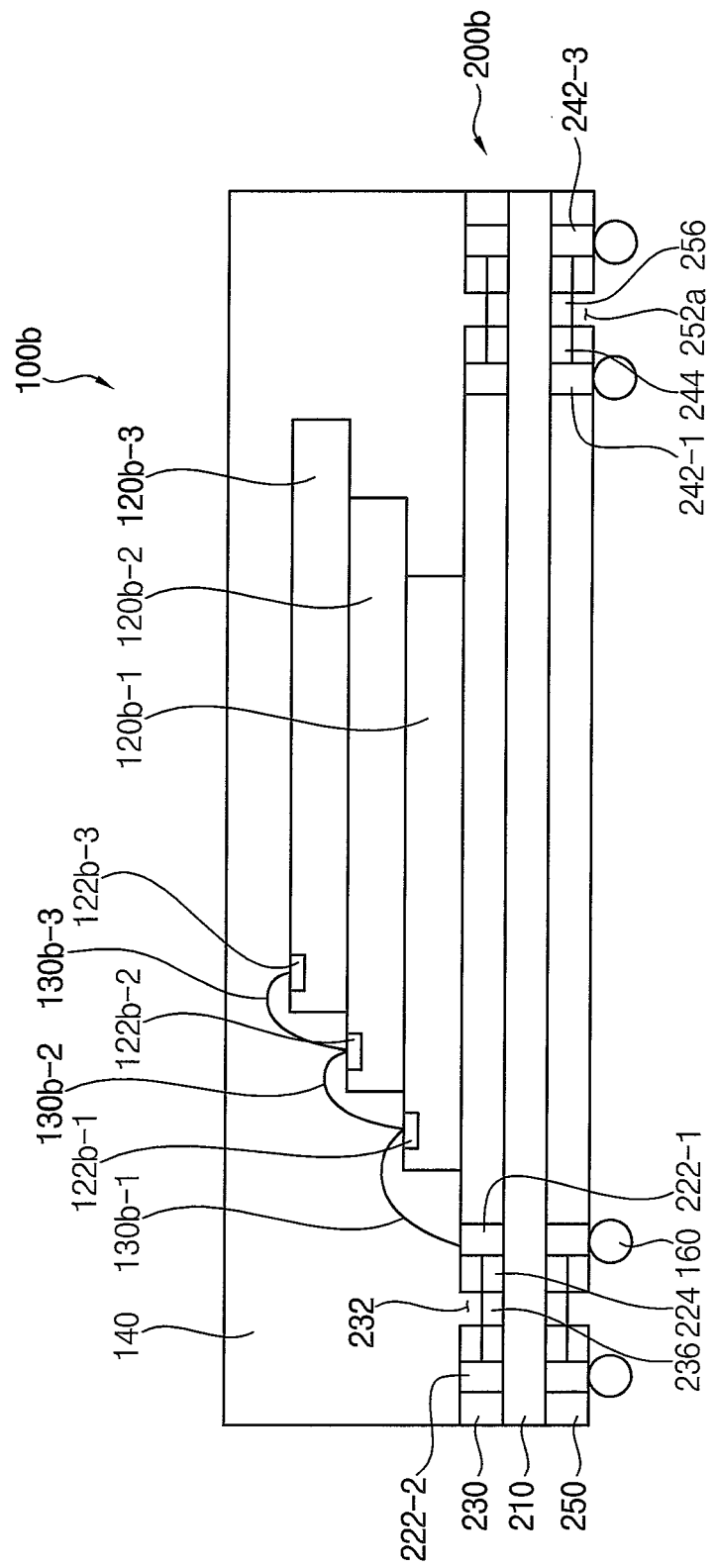
FIG. 18 is a cross-sectional view illustrating a semiconductor package including the package substrate in FIG. 9 according to an exemplary embodiment of the present inventive concept.

FIG. 18 is a cross-sectional view illustrating a semiconductor package including the package substrate in FIG. 9 according to an exemplary embodiment of the present inventive concept.

A semiconductor package 100b of this embodiment may include elements substantially the same as those of the semiconductor package 100 in FIG. 16 except for a semiconductor chip. Thus, the same reference numerals may refer to the same elements and any further illustrations with respect to the same elements may be omitted herein for brevity.

Referring to FIG. 18, the semiconductor package 100b may include stacked first to third semiconductor chips 120b-1, 120b-2 and 120b-3. The first to third semiconductor chips 120b-1, 120b-2 and 120b-3 may be stacked in a steplike shape to expose pads 122b-1, 122b-2 and 122b-3 of the first to third semiconductor chips 120b-1, 120b-2 and 120b-3. For example, the first to third semiconductor chips 120b-1, 120b-2 and 120b-3 may be stacked such that each of them may be misaligned with one another. In addition, the semiconductor package 100b may include a steplike-shape including two or at least four stacked semiconductor chips. However, the present inventive concept is not limited thereto.

A first conductive wire 130b-1 may be electrically connected between the pad 122b-1 of the first semiconductor chip 120b-1 and the upper conductive pattern 220 of the package substrate 200b. A second conductive wire 130b-2 may be electrically connected between the pad 122b-1 of the first semiconductor chip 120b-1 and the pad 122b-2 of the second semiconductor chip 120b-2. A third conductive wire 130b-3 may be electrically connected between the pad 122b-3 of the third semiconductor chip 120b-3 and the pad 122b-2 of the second semiconductor chip 120b-2.

In addition, the semiconductor package 100b may include the package substrate 200 in FIG. 1 or the package substrate 200a in FIG. 5.

Figure 19:
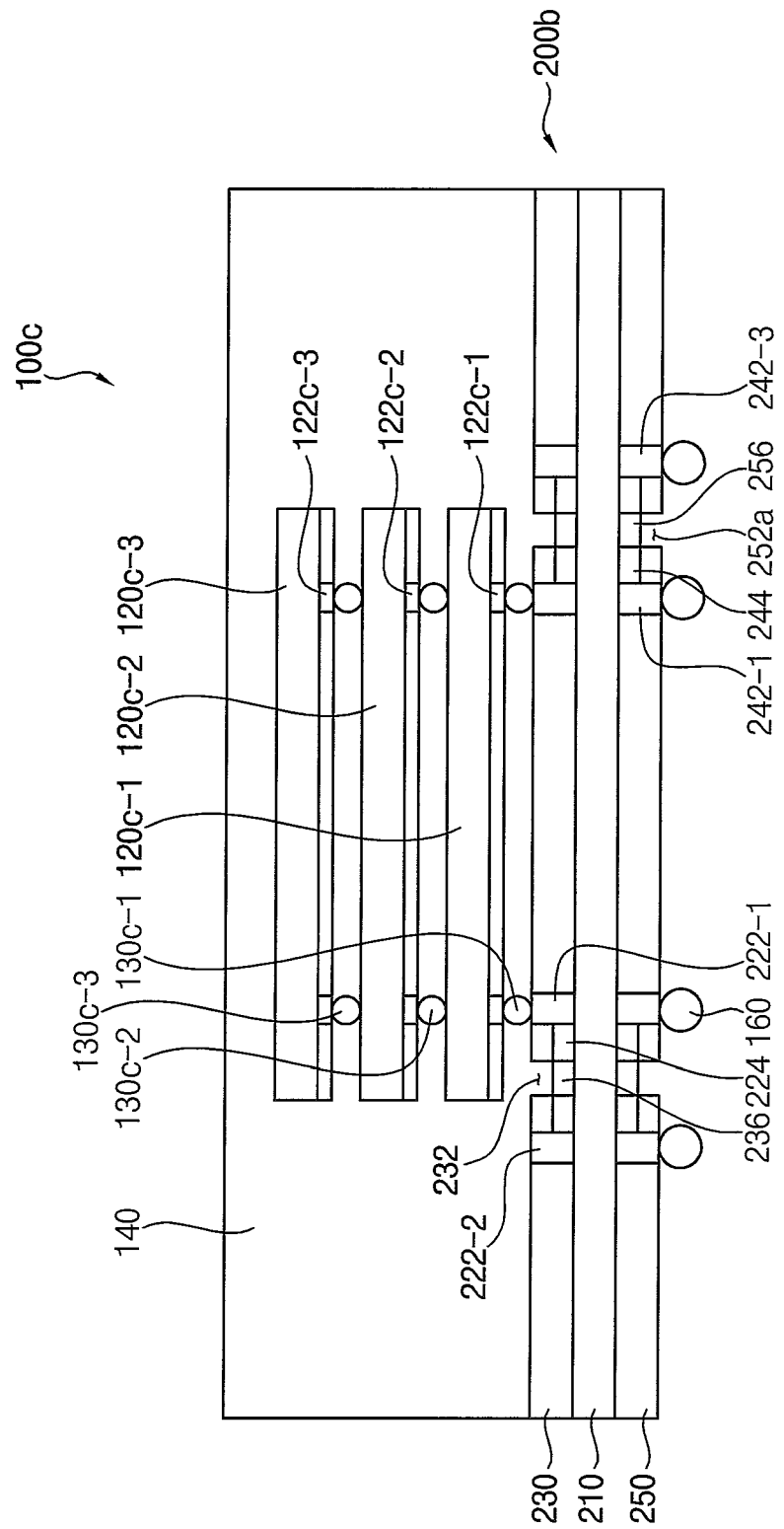
FIG. 19 is a cross-sectional view illustrating a semiconductor package including the package substrate in FIG. 9 according to an exemplary embodiment of the present inventive concept.

FIG. 19 is a cross-sectional view illustrating a semiconductor package including the package substrate in FIG. 9 according to an exemplary embodiment of the present inventive concept.

A semiconductor package 100c of this embodiment may include elements substantially the same as those of the semiconductor package 100 in FIG. 16 except for a semiconductor chip. Thus, the same reference numerals may refer to the same elements and any further illustrations with respect to the same elements may be omitted herein for brevity.

Referring to FIG. 19, the semiconductor package 100c may include first to third semiconductor chips 120c-1, 120c-2 and 120c-3 stacked on one another. Pads 122c-1, 122c-2 and 122c-3 may be arranged on lower surfaces of the first to third semiconductor chips 120c-1, 120c-2 and 120c-3, respectively. The first to third semiconductor chips 120c-1, 120c-2 and 120c-3 may include connection vias vertically formed through the first to third semiconductor chips 120c-1, 120c-2 and 120c-3. In addition, the semiconductor package 100c may include a steplike-shape including two or at least four stacked semiconductor chips. However, the present inventive concept is not limited thereto.

A first conductive bump 130c-1 may be interposed between the package substrate 200b and the first semiconductor chip 120c-1 to electrically connect the pad 122c-1 of the first semiconductor chip 120c-1 with the upper conductive pattern 220 of the package substrate 200b. A second conductive bump 130c-2 may be interposed between the first semiconductor chip 130c-1 and the second semiconductor chip 130c-2 to electrically connect the pad 122c-1 of the first semiconductor chip 120c-1 with the pad 122c-2 of the second semiconductor chip 120c-2. A third conductive bump 130c-3 may be interposed between the second semiconductor chip 130c-2 and the third semiconductor chip 130c-3 to electrically connect the pad 122c-3 of the third semiconductor chip 120c-3 with the pad 122c-2 of the second semiconductor chip 120c-2.

In addition, the semiconductor package 100c may include the package substrate 200 in FIG. 1 or the package substrate 200a in FIG. 5.

According to an exemplary embodiment of the present inventive concept, the reinforcing portion may be arranged in the trench of the package substrate to increase a thickness of the package substrate in the boundary region. Thus, the package substrate in the boundary region may have reinforced strength to suppress a warpage of the package substrate with respect to the boundary region.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A package substrate comprising:
 a core insulation layer having a first package region, a second package region and a boundary region between the first package region and the second package region;
 a first upper conductive pattern arranged on the core insulation layer in the first package region;
 a second upper conductive pattern arranged on the core insulation layer in the second package region, wherein the second upper conductive pattern is electrically isolated from the first upper conductive pattern;
 a first insulation pattern arranged on the core insulation layer to at least partially expose the first upper conductive pattern and the second upper conductive pattern, wherein the first insulation pattern includes a first trench formed at the boundary region, and a plurality of first reinforcing portions arranged in the first trench;
 a first lower conductive pattern arranged on the core insulation layer in the first package region and electrically connected with the first upper conductive pattern;
 a second lower conductive pattern arranged on the core insulation layer in the second package region and electrically connected with the second upper conductive pattern, wherein the second lower conductive pattern is electrically isolated from the first lower conductive pattern; and
 a second insulation pattern arranged on the core insulation layer to at least partially expose the first lower conductive pattern and the second lower conductive pattern, wherein the second insulation pattern includes a second trench formed at the boundary region, and a plurality of second reinforcing portions arranged in the second trench,
 wherein each of the first reinforcing portions has a thickness of about 20% to about 80% of a thickness of the first insulation pattern, and each of the second reinforcing portions has a thickness of about 20% to about 80% of a thickness of the second insulation pattern.

2. The package substrate of claim 1, wherein the first reinforcing portions are a part of the first insulation pattern, and the second reinforcing portions are a part of the second insulation pattern.

3. The package substrate of claim 2, wherein each of the first insulation pattern and the second insulation pattern comprises solder resist.

4. The package substrate of claim 1, wherein the first insulation pattern has a plurality of first insulation holes formed between the first reinforcing portions to isolate the first upper conductive pattern from the second upper conductive pattern, and the second insulation pattern has a plurality of second insulation holes formed between the second reinforcing portions to isolate the first lower conductive pattern from the second lower conductive pattern.

5. The package substrate of claim 1, wherein each of the first reinforcing portions has a lower surface contacting an upper surface of the core insulation layer.

6. The package substrate of claim 1, wherein each of the second reinforcing portions has an upper surface contacting a lower surface of the core insulation layer.

7. A package substrate comprising:
 a core insulation layer having at least two package regions and a boundary region between the at least two package regions;
 upper conductive patterns arranged on the core insulation layer;
 an upper insulation pattern arranged on the core insulation layer to at least partially expose the upper conductive patterns, wherein the upper insulation pattern includes an upper trench formed at the boundary region;
 lower conductive patterns arranged on the core insulation layer;
 a lower insulation pattern arranged on the core insulation layer to partially expose the lower conductive patterns, wherein the lower insulation pattern includes a lower trench formed at the boundary region; and
 a reinforcing portion arranged in at least one of the upper trench or the lower trench.

8. The package substrate of claim 7, wherein the reinforcing portion is a part of at least one of the upper insulation pattern or the lower insulation pattern.

9. The package substrate of claim 8, wherein each of the upper insulation pattern and the lower insulation pattern comprises solder resist.

10. The package substrate of claim 7, wherein the reinforcing portion comprises:
 upper reinforcing portions overlapping the upper trench and positioned between a plurality of upper insulation holes configured to electrically isolate the upper conductive patterns from each other; and lower reinforcing portions overlapping the lower trench and positioned between a plurality of lower insulation holes configured to electrically isolate the lower conductive patterns from each other.

11. The package substrate of claim 10, wherein each of the upper reinforcing portions has a lower surface contacting an upper surface of the core insulation layer.

12. The package substrate of claim 10, wherein each of the lower reinforcing portions has an upper surface contacting a lower surface of the core insulation layer.

13. The package substrate of claim 10, wherein each of the upper reinforcing portions has a thickness of about 20% to about 80% of a thickness of the upper insulation pattern.

14. The package substrate of claim 10, wherein each of the lower reinforcing portions has a thickness of about 20% to about 80% of a thickness of the lower insulation pattern.

15. The package substrate of claim 7, wherein the upper trench and the lower trench surround each of the at least two package regions.

16. The package substrate of claim 7, wherein the upper conductive patterns comprise:
    a first upper conductive pattern arranged on an upper surface of the core insulation layer in a first package region among the at least two package regions; and
    a second upper conductive pattern arranged on the upper surface of the core insulation layer in a second package region of the at least two package regions, wherein the second package region is adjacent to the first package region, and the second upper conductive pattern is electrically isolated from the first upper conductive pattern by the upper trench.

17. The package substrate of claim 7, wherein the lower conductive patterns comprise:
    a first lower conductive pattern arranged on a lower surface of the core insulation layer in a first package region among the at least two package regions; and
    a second lower conductive pattern arranged on the lower surface of the core insulation layer in a second package region of the at least two package regions, wherein the second package region is adjacent to the first package region, and the second lower conductive pattern is electrically isolated from the first lower conductive pattern by the lower trench.

18. A semiconductor package comprising:
    a package substrate including a core insulation layer, an upper conductive pattern, an upper insulation pattern, a lower conductive pattern, a lower insulation pattern and a reinforcing portion, wherein the core insulation layer has at least two package regions and a boundary region between the at least two package regions, wherein the upper conductive pattern is arranged on the core insulation layer, wherein the upper insulation pattern is arranged on the core insulation layer to at least partially expose the upper conductive patterns, wherein the upper insulation pattern includes an upper trench formed at the boundary region, wherein the lower conductive pattern is arranged on the core insulation layer, wherein the lower insulation pattern is arranged on the core insulation layer to partially expose the lower conductive patterns, wherein the lower insulation pattern includes a lower trench formed at the boundary region, and wherein the reinforcing portion is arranged in at least one of the upper trench or the lower trench;
    at least one semiconductor chip arranged on the package substrate and electrically connected with the upper conductive pattern; and
    a molding member arranged on the package substrate to cover the at least one semiconductor chip.

19. The semiconductor package of claim 18, wherein the reinforcing portion is a part of at least one of the upper insulation pattern or the lower insulation pattern.

20. The semiconductor package of claim 18, further comprising external terminals mounted on the package substrate and electrically connected with the lower conductive pattern.

* * * * *